US007891064B2

(12) United States Patent
Kang et al.

(10) Patent No.: US 7,891,064 B2
(45) Date of Patent: Feb. 22, 2011

(54) PIEZOELECTRIC INKJET HEAD AND METHOD OF MANUFACTURING THE SAME

(75) Inventors: Sung-gyu Kang, Suwon-si (KR); Young-ki Hong, Anyang-si (KR); Jae-woo Chung, Yongin-si (KR); Se-young Oh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 838 days.

(21) Appl. No.: 11/768,293

(22) Filed: Jun. 26, 2007

(65) Prior Publication Data

US 2008/0165228 A1 Jul. 10, 2008

(30) Foreign Application Priority Data

Jan. 5, 2007 (KR) ...................... 10-2007-0001697

(51) Int. Cl.
*H01L 41/22* (2006.01)
*B41J 2/045* (2006.01)

(52) U.S. Cl. ........................................ 29/25.35; 347/68

(58) Field of Classification Search ................... 347/68, 347/70–72, 93; 29/25.35
See application file for complete search history.

(56) References Cited

U.S. PATENT DOCUMENTS 6,536,879 B2 * 3/2003 Ito et al. ........................ 347/71
6,701,593 B2 * 3/2004 Lin et al. ................... 29/25.35
6,862,783 B2 * 3/2005 Nishikawa et al. ......... 29/25.35
7,121,650 B2 * 10/2006 Chung et al. .................. 347/68
2003/0112300 A1 6/2003 Chung et al.

FOREIGN PATENT DOCUMENTS

KR 2003-50477 6/2003

* cited by examiner

*Primary Examiner*—An H Do
(74) *Attorney, Agent, or Firm*—Stanzione & Kim, LLP

(57) ABSTRACT

A piezoelectric inkjet head and a method of manufacturing the piezoelectric inkjet head. The piezoelectric inkjet head includes three single crystal silicon substrates bonded to each other. An upper substrate includes an ink inlet, a plurality of pressure chambers, and a plurality of piezoelectric actuators, a middle substrate includes a manifold, a plurality of restrictors, and a plurality of first dampers, and a lower substrate includes a plurality of nozzles. The middle substrate also includes a membrane that is formed under the manifold to mitigate a rapid pressure change in the manifold and if formed of a material different from the material used for forming the middle substrate. A cavity located under the membrane and at least one venting channel that connects the cavity to the outside are formed in the middle substrate or the lower substrate. Due to the above configuration, the membrane having flexibility mitigates a rapid pressure change in the manifold caused by backflow of ink, and thus, cross-talk between adjacent pressure chambers during ink ejection can be effectively prevented.

16 Claims, 15 Drawing Sheets

PIEZOELECTRIC INKJET HEAD AND METHOD OF MANUFACTURING THE SAME

CROSS-REFERENCE TO RELATED APPLICATIONS

This application claims the benefit of Korean Patent Application No. 10-2007-0001697, filed on Jan. 5, 2007, in the Korean Intellectual Property Office, the disclosure of which is incorporated herein in its entirety by reference.

BACKGROUND OF THE INVENTION

1. Field of the Invention

The present general inventive concept relates to a piezoelectric inkjet head, and more particularly, to a piezoelectric inkjet head having a membrane to prevent cross-talk, and a method of manufacturing the same.

2. Description of the Related Art

An inkjet head is a device for printing a predetermined color image by ejecting minute droplets of ink on desired areas of a printing medium. Inkjet heads are nowadays also used in flat panel displays such as liquid crystal displays (LCDs), organic light emitting diodes (OLEDs), plasma display panels (PDPs), and printed circuit boards including metal wirings and resistances, and semiconductor packaging.

Inkjet heads can be generally classified into two types according to the method of ejecting ink droplets. One type is a thermal inkjet head that ejects ink droplets using the expansion force of ink bubbles created using a heat source, and the other type is a piezoelectric inkjet head that ejects inkjet droplets using a pressure created by the deformation of a piezoelectric element.

FIG. 1 is an exploded perspective view of a conventional piezoelectric inkjet head which has been disclosed in Korean Patent Publication No. 2003-0050477 (U.S. Patent Publication No. 2003-0112300) by the applicant of the present general inventive concept.

Referring to FIG. 1, the conventional piezoelectric inkjet head has a structure in which three silicon substrates 30, 40, and 50 are stacked and combined. Of the three silicon substrates 30, 40, and 50, the upper substrate 30 has a plurality of pressure chambers 32 having a predetermined depth on a lower surface thereof. An ink inlet 31 connected to an ink storage (not shown) is formed through the upper substrate 30. The pressure chambers 32 are arranged in two rows on both sides of a manifold 41 formed in the middle substrate 40. A plurality of piezoelectric actuators 60 that provide a driving force to eject ink to each of the pressure chambers 32 are formed on an upper surface of the upper substrate 30. The middle substrate 40 includes a manifold 41 connected to the ink inlet 31, and a plurality of restrictors 42 respectively connected to each of the pressure chambers 32 are formed on the both sides of the manifold 41. Also, the middle substrate 40 includes a plurality of first dampers 43 perpendicularly formed through the middle substrate 40 on positions corresponding to each of the pressure chambers 32. A plurality of second dampers 53 connected to the first dampers 43 are formed in upper part of the lower substrate 50, and a plurality of nozzles 51 connected to the second dampers 53 are formed in a lower part of the lower substrate 50.

However, in the conventional piezoelectric inkjet head having the above structure, when the pressure of each of the pressure chambers 32 is increased by the driving of the piezoelectric actuators 60, the ink in the pressure chambers 32 is ejected to the outside through the nozzles 51, and at the same time, backflows towards the manifold 41 through the restrictors 42. Due to the backflow of ink, the pressure in the manifold 41 becomes non-uniform, and a pressure change in the manifold 41 affects to the adjacent pressure chambers 32, that is, cross-talk occurs. The cross-talk causes unstable meniscus of ink in the nozzles 51 connected to the adjacent pressure chambers 32, and thus, causes variations of the speed and volume of ink droplets ejected through each of the nozzles 51.

SUMMARY OF THE INVENTION

The present general inventive concept provides a piezoelectric inkjet head that prevents cross-talk between pressure chambers by mitigating a rapid pressure change in a manifold using a membrane formed on a lower surface of the manifold.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a piezoelectric inkjet head including: an upper substrate that includes an ink inlet that is formed through the upper substrate, a plurality of pressure chambers formed in a lower part of the upper substrate to be filled with ink to be ejected, and a plurality of piezoelectric actuators formed on an upper surface of the upper substrate to provide a driving force to eject ink to each of the pressure chambers; a middle substrate that is combined with a lower surface of the upper substrate, and includes a manifold formed in upper part of the middle substrate and connected to the ink inlet, a plurality of restrictors that connect the manifold to the pressure chambers, and a plurality of first dampers formed on locations corresponding to the pressure chambers; and a lower substrate that is combined with a lower surface of the middle substrate, and includes a plurality of nozzles formed on locations corresponding to the first dampers to eject ink, wherein the middle substrate includes a membrane that is formed under the manifold to mitigate a rapid pressure change in the manifold, wherein the membrane is formed of a material different from the material used to form the middle substrate, and a cavity formed under the membrane and at least one venting channel that connects the cavity to the outside are formed in the middle substrate or in the lower substrate.

The middle substrate may be formed of silicon and the membrane is formed of silicon nitride, and the membrane may have a thickness of 1 to 3 μm.

The membrane has a width greater than that of the manifold. The cavity may have a width equal to or greater than that of the membrane.

The cavity may be formed to a predetermined depth in a lower part of the middle substrate. At least one venting channel having a depth equal to the depth of the cavity may be formed on a lower surface of the middle substrate or at least one venting channel may be vertically formed through the lower substrate.

The membrane may be formed to protrude from the lower surface of the middle substrate, and the cavity may be formed to a predetermined depth in the upper part of the lower substrate.

In this case, at least one venting channel having a depth identical to that of the cavity may be formed in the upper part of the lower substrate or at least one venting channel may be vertically formed through the lower substrate.

The manifold may include a plurality of individual manifolds defined by a plurality of barrier ribs to correspond to each of the pressure chambers.

A plurality of supporting walls that support the membrane may be formed in the cavity. The supporting walls may include connection grooves that connect the entire portions of the cavity.

A plurality of filtering holes may be formed above the ink inlet.

A plurality of second dampers that connect the first dampers and the nozzles may be formed to a predetermined depth in the upper part of the lower substrate.

The foregoing and/or other aspects and utilities of the present general inventive concept may also be achieved by providing a method of manufacturing a piezoelectric inkjet head, including (a) preparing an upper substrate, a middle substrate, and a lower substrate, which are formed of silicon; (b) forming an ink inlet and a plurality of pressure chambers to be filled with ink to be ejected by finely processing the upper substrate; (c) forming a manifold connected to the ink inlet, a plurality of restrictors that connect the manifold to the pressure chambers, and a plurality of first dampers in locations corresponding to the pressure chambers by finely processing the middle substrate; (d) forming a plurality of nozzles to eject the ink by finely processing the lower substrate; (e) bonding the lower substrate, the middle substrate, and the upper substrate by sequentially stacking them; and (f) forming a plurality of piezoelectric actuators that provide a driving force to eject ink on the upper surface of the upper substrate, wherein (c) includes forming a membrane under the manifold to mitigate a rapid pressure change in the manifold using a material different from the material used to form the middle substrate, and (c) or (d) includes forming a cavity located under the membrane and at least one venting channel that connects the cavity to the outside on the lower surface of the middle substrate or the upper surface of the lower substrate.

The membrane may be formed of silicon nitride, and may have a thickness of 1 to 3 μm.

The operation (c) may include: forming the cavity having a predetermined depth by etching the lower surface of the middle substrate; forming a silicon oxide film on the lower surface of the middle substrate and an inner surface of the cavity; forming a material film different from silicon on the entire surface of the silicon oxide film; forming the membrane formed of the material film remaining in the inner surface of the cavity by removing the silicon oxide film and the material film formed on the surface of the middle substrate except for the portion formed on the inner surface of the cavity using a chemical mechanical polishing (CMP) method; forming the manifold, the restrictors, and the first dampers by etching the upper part of the middle substrate from the upper surface of the middle substrate; and removing the silicon oxide film.

The material film may be a silicon nitride film. Also, the manifold and the restrictors may be formed to have a depth shallower than that of the first damper due to the silicon oxide film that acts as an etch stop layer.

In the operation of forming the cavity, at least one venting channel may be formed together with the cavity on the lower surface of the middle substrate. The venting channels may be vertically formed through the lower substrate in the operation for forming the nozzles.

The operation (c) may include: sequentially forming the silicon oxide film and the material film using a material different from silicon on the lower surface of the middle substrate; forming the membrane formed of the material film remaining on a portion where the manifold is formed by partially removing the silicon oxide film and the material film by etching; forming the manifold, the restrictors, and the first dampers by etching the upper part of the middle substrate from the upper surface of the middle substrate; and removing the silicon oxide film, and the operation (d) includes forming the cavity having a predetermined depth by etching the upper surface of the lower substrate.

In the operation of forming the cavity, at least one venting channel may be formed together with the cavity on the lower surface of the middle substrate.

The operation (a) may include forming a plurality of filtering holes above the ink inlet.

In the operation (c), the manifold may be formed to include a plurality of individual manifolds defined by a plurality of barrier ribs to correspond the each of the pressure chambers.

The operation (c) or (d) may include forming supporting walls that support the membrane in the cavity.

The operation (d) may include forming a plurality of second dampers that connect the first dampers to the nozzles in the upper part of the lower substrate.

The foregoing and/or other aspects and utilities of the present general inventive concept may also be achieved by providing a piezoelectric inkjet head, including an ink flow channel having a manifold connected to an ink inlet to receive ink from an outside source, a plurality of pressure chambers to be filled with ink received from the manifold, a plurality of restrictors that connect the manifold to the pressure chambers to restrict the flow of ink therebetween, a plurality of dampers formed to correspond with respective ones of the pressure chambers to eject the ink from the respective pressure chambers, a membrane that forms a surface of the manifold to mitigate a rapid pressure change in the manifold, the membrane being formed of a material different from the material used to form walls of the manifold, and a cavity formed under the membrane and between the manifold walls to allow the membrane to flex to absorb pressure from the ink received through the ink inlet.

The cavity may include a plurality of supporting walls that support the membrane.

The surface of the manifold that the membrane forms can be a bottom surface, a top surface, or one of the side surfaces.

BRIEF DESCRIPTION OF THE DRAWINGS

The above and other aspects and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
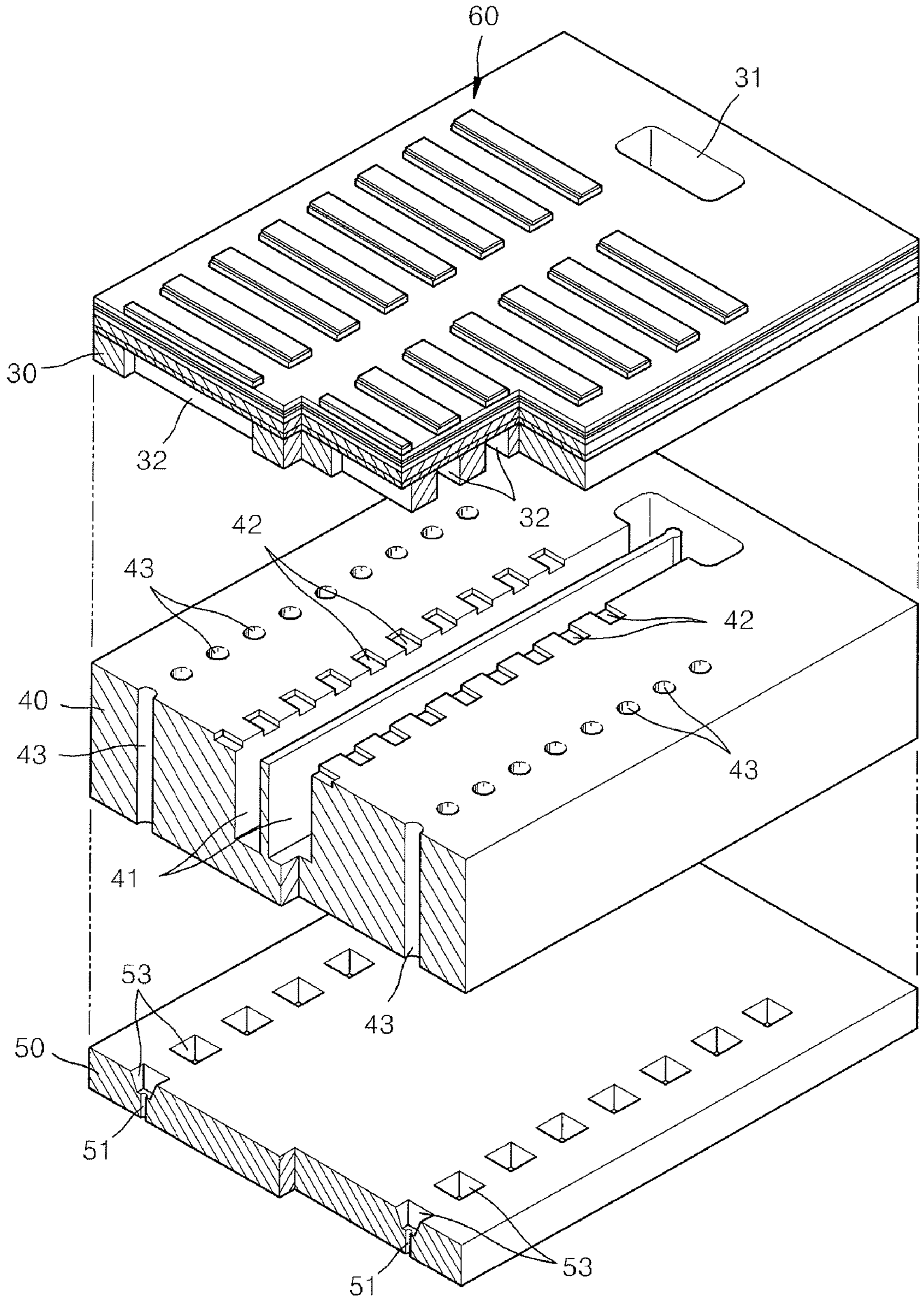
FIG. 1 (PRIOR ART)
FIG. 1 is an exploded perspective view of a conventional piezoelectric inkjet head.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
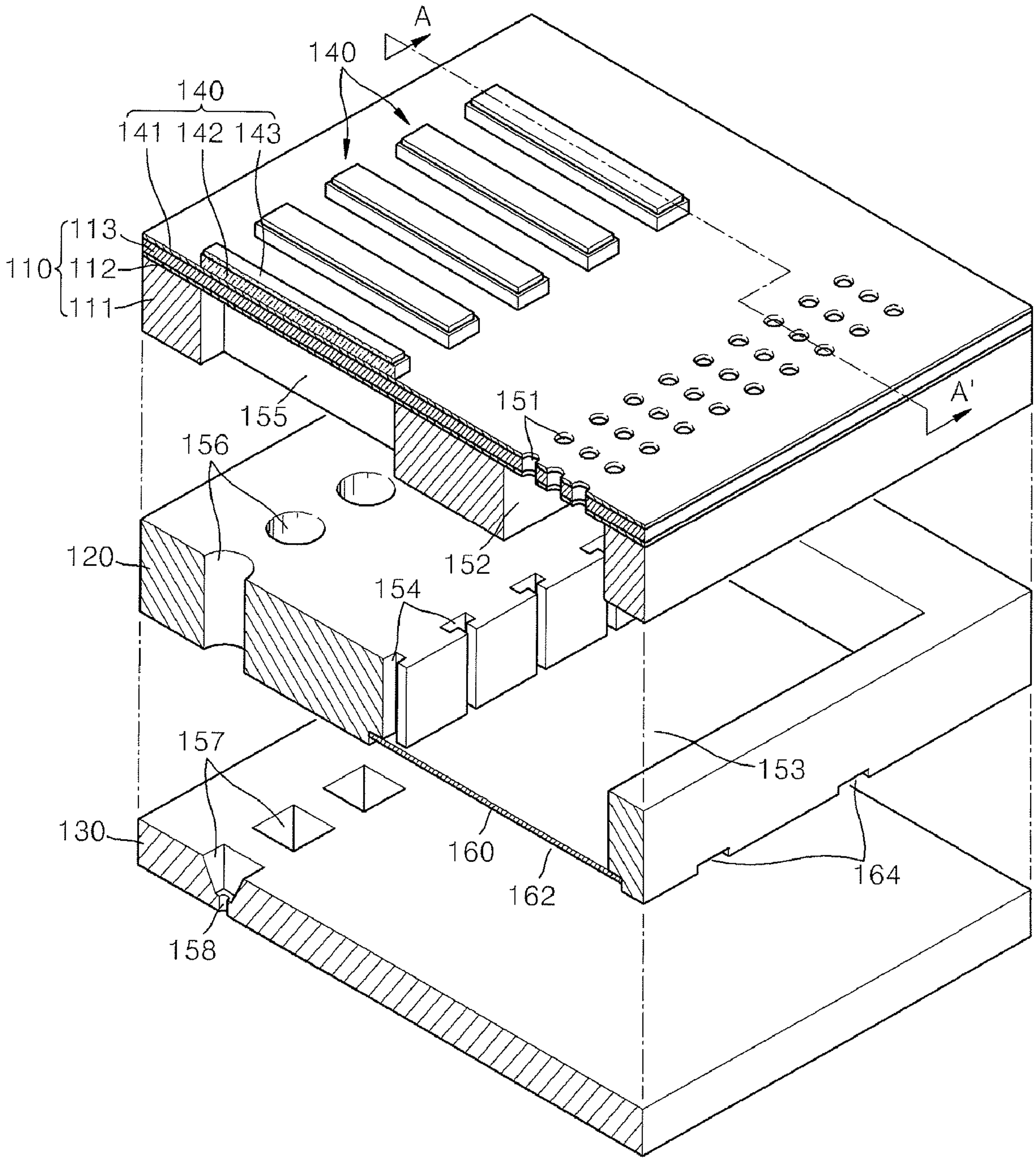
FIG. 2 is a partial cutaway exploded perspective view of a piezoelectric inkjet head according to an embodiment of the present general inventive concept.
Figure 3:
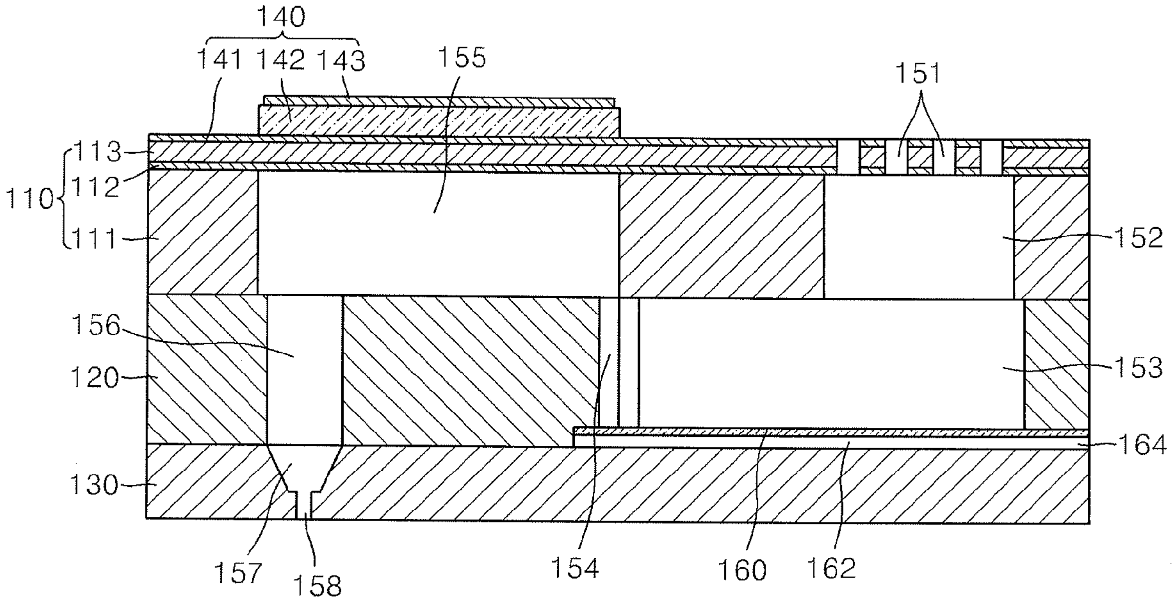
FIG. 3 is a vertical cross-sectional view taken along A-A' of the assembled piezoelectric inkjet head of FIG. 2, according to an embodiment of the present general inventive concept.

FIG. 2 is a partial cutaway exploded perspective view of a piezoelectric inkjet head according to an embodiment of the present general inventive concept. FIG. 3 is a vertical cross-sectional view taken along A-A' of the assembled piezoelectric inkjet head of FIG. 2.

Referring to FIGS. 2 and 3, the piezoelectric inkjet head according to this embodiment includes three stacked substrates, that is, an upper substrate 110, a middle substrate 120, and a lower substrate 130. An ink flow channel is formed in the three substrates 110, 120, and 130, and a plurality of piezoelectric actuators 140 that generate a driving force to eject ink are formed on an upper surface of the upper substrate 110. The upper substrate 110, the middle substrate 120, and the lower substrate 130 can be single crystal silicon substrates that are widely used for manufacturing semiconductor integrated circuits.

The ink flow channel includes an ink inlet 152 through which ink enters from an ink storage (not shown), a manifold 153 which is a path to pass the ink entered through the ink inlet 152, a plurality of pressure chambers 155 filled with the ink supplied from the manifold 153, and a plurality of nozzles 158 through which the ink is ejected from the pressure chambers 155. Also, the ink flow channel further includes a plurality of restrictors 154 that connect the manifold 153 to each of the pressure chambers 155, and first dampers 156 and second dampers 157 that respectively connect the pressure chambers 155 to the nozzles 158. As described above, the elements that constitute the ink flow channel are formed in the three substrates 110, 120, and 130.

More specifically, the upper substrate 110 includes the ink inlet 152 and the plurality of pressure chambers 155.

The ink inlet 152 is vertically formed through the upper substrate 110 to be connected to the manifold 153 formed in the middle substrate 120 which will be described later. The ink inlet 152 can be formed to be long along a lengthwise direction of the manifold 153 to correspond to the manifold 153. The ink inlet 152 can include a plurality of filtering holes 151 formed therein. The filtering holes 151 have a diameter of 10 to 20 μm, and filter foreign materials or impurity materials contained in ink when the ink enters to the manifold 153 from an ink storage (not shown).

The pressure chambers 155 can be formed to a predetermined depth in a lower part of the upper substrate 110. The pressure chambers 155 can be arranged in a row on a side of the manifold 153, and each can be formed in a rectangular parallelepiped shape whose side in a direction of ink flow is longer than the other side. Also, the pressure chambers 155 can be arranged in two rows on both sides of the manifold 153.

As described above, the upper substrate 110 may be a single crystal silicon substrate, in particular, a silicon-on insulator (SOI) substrate. The SOI substrate has a structure in which a first silicon layer 111, a middle oxide film 112 formed on the first silicon layer 111, and a second silicon layer 113 stacked on the middle oxide film 112 are stacked. The purpose of using the SOI substrate as the upper substrate 110 is to precisely control the depth of the pressure chambers 155. That is, since the middle oxide film 112 of the SOI substrate functions as an etch stopper in the process of forming the pressure chambers 155, if the thickness of the first silicon layer 111 is determined, the depth of the pressure chambers 155 is accordingly determined. Also, the second silicon layer 113 that constitutes upper walls of the pressure chambers 155 functions as a vibrating plate that causes a pressure change in the pressure chambers 155 due to vibrations caused by the piezoelectric actuators 140. Thus, the thickness of the vibrating plate is also determined by the thickness of the second silicon layer 113.

The piezoelectric actuators 140 can be formed on an upper surface of the upper substrate 110. Each of the piezoelectric actuators 140 can include a lower electrode 141 that performs as a common electrode, a piezoelectric film 142 that is deformed by a voltage applied thereto, and an upper electrode 143 that performs as a driving electrode. The lower electrode 141 can be formed on the entire surface of the upper substrate 110 using a conductive metal material. The piezoelectric films 142 are formed on the lower electrode 141, and are disposed on each of the pressure chambers 155. The piezoelectric film 142 can be formed of a piezoelectric material, preferably, a lead zirconate titanate (PZT) ceramic material. When the piezoelectric films 142 are deformed by a voltage applied thereto, the piezoelectric films 142 vibrate the second silicon layer 113, that is, a vibrating plate, of the upper substrate 110 that constitutes the upper wall of the pressure chambers 155. The upper electrodes 143 are formed on the piezoelectric films 142, and perform as driving electrodes that apply a voltage to the piezoelectric films 142.

The middle substrate 120 includes a manifold 153, the plurality of restrictors 154, and the plurality of first dampers 156. Also, the middle substrate 120 can include a membrane 160 formed on a lower surface of the manifold 153. A cavity 162 is formed under the membrane 160, and venting channels 164 that connect the cavity 162 to the outside are formed in the middle substrate 120.

The manifold 153 is formed to have a predetermined depth from the upper surface of the middle substrate 120, and can have a shape extending in a direction. Each of the restrictors 154 can have an approximately "T" shaped cross-section, and can have the same depth as the manifold 153. The restrictors 154 can be formed in various shapes different from the shape shown in FIG. 2. Each of the first dampers 156 is vertically formed through the middle substrate 120 to be connected to the pressure chambers 155.

The membrane 160, which is a characteristic feature of the present general inventive concept, can be formed under the manifold 153 to mitigate a rapid pressure change in the manifold 153 due to ink backflow from the pressure chambers 155. The membrane 160 is formed of a material different from silicon which is used for forming the middle substrate 120. The membrane 160 may be formed of a material film having a high thermal resistance and a high etch-selectivity with respect to a silicon oxide film, for example, a silicon nitride film. Also, the membrane 160 may have a thickness of approximately 1 to 3 μm, and preferably, 1 to 2 μm to have an appropriate flexibility. If the thickness of the membrane 160 is too thick, the flexibility is reduced, and if the thickness is too thin, durability is reduced. In order to increase the bonding strength with the middle substrate 120, the membrane 160 may be formed to have a width slightly greater than that of the manifold 153. That is, a predetermined width of an edge of the membrane 160 combines with a lower surface of the middle substrate 120. The membrane 160 can be formed to have a width equal to or less than the width of the manifold 153.

The cavity 162 is formed under the membrane 160 to allow the membrane 160 to be freely deformed. The cavity 162 can be formed to have a predetermined depth from the lower surface of the middle substrate 120, and has a width substantially identical to that of the membrane 160.

The venting channels 164 may be formed to have a predetermined depth from the lower surface of the middle substrate 120, preferably, an identical depth to the cavity 162, and are connected to the outside by extending from the cavity 162 to the edge of the middle substrate 120. This is because, if the cavity 162 is sealed, the free deformation of the membrane 160 can be interrupted due to internal pressure of the cavity 162. One venting channel 164 can be formed, or a plurality of venting channels 164 separated by appropriate gaps from each other can be formed along the lengthwise direction of the cavity 162.

As described above, according to the present embodiment, the flexible membrane 160 that can be formed under the manifold 153 mitigates a rapid pressure change in the manifold 153 caused by backflow of ink from the pressure chambers 155, and thus, the cross-talk between adjacent pressure chambers 155 can be effectively prevented when ink is ejected. Accordingly, a uniform ink ejection performance through the nozzles 158 can be achieved, thereby improving printing quality. Also, after ink ejection, meniscus of ink in the nozzles 158 can be rapidly recovered, and thus, ejection frequency can be increased.

The lower substrate 130 includes the plurality of second dampers 157 and the plurality of nozzles 158.

The second dampers 157 are formed to have a predetermined depth from an upper surface of the lower substrate 130. The second dampers 157 can have rectangular shaped cross-sections, and laterals of the second dampers 157 can be formed to have a slope by anisotropical etching. That is, the cross-sections of the second dampers 157 are gradually reduced away from the upper surface of the lower substrate 130 towards the lower part of the lower substrate 130. Each of the nozzles 158 is vertically formed through the lower substrate 130 from the bottom surface of the second damper 157. Each of the nozzles 158 can be a hole having a predetermined diameter.

A piezoelectric inkjet head according to the present embodiment can be formed by stacking the upper substrate 110, the middle substrate 120, and the lower substrate 130 formed as described above.

Figure 4:
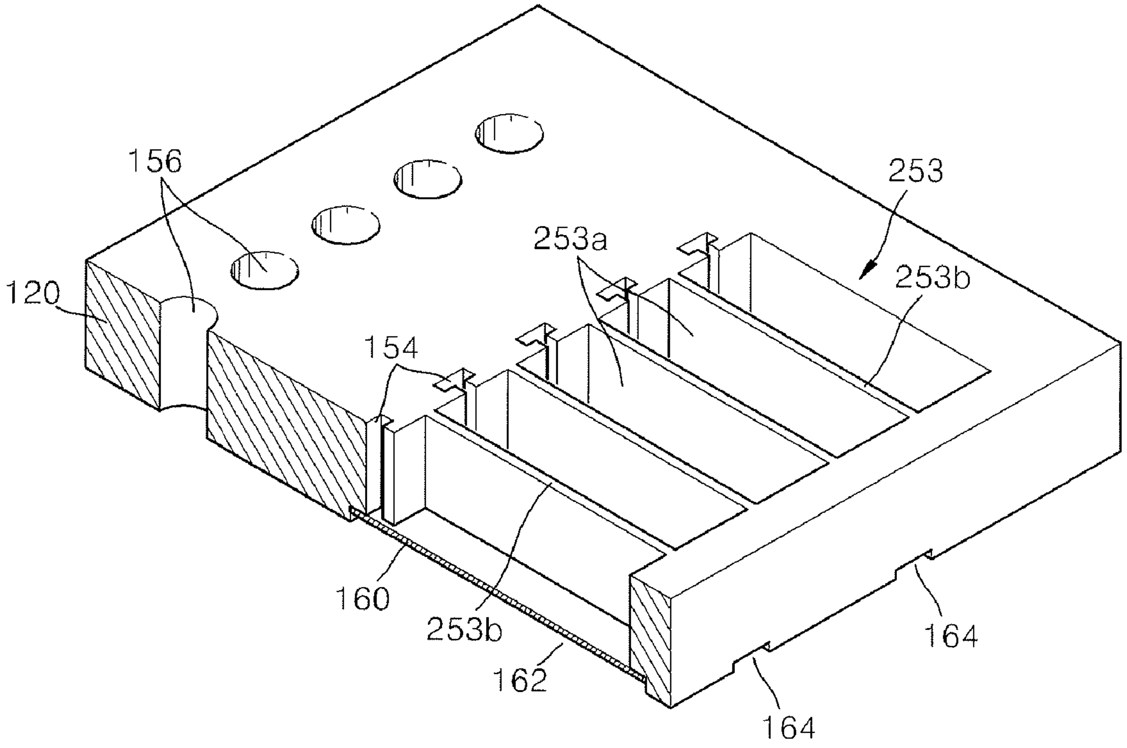
FIG. 4 is a perspective view of the middle substrate showing a modified version of the manifold of FIG. 2.
Figure 5:
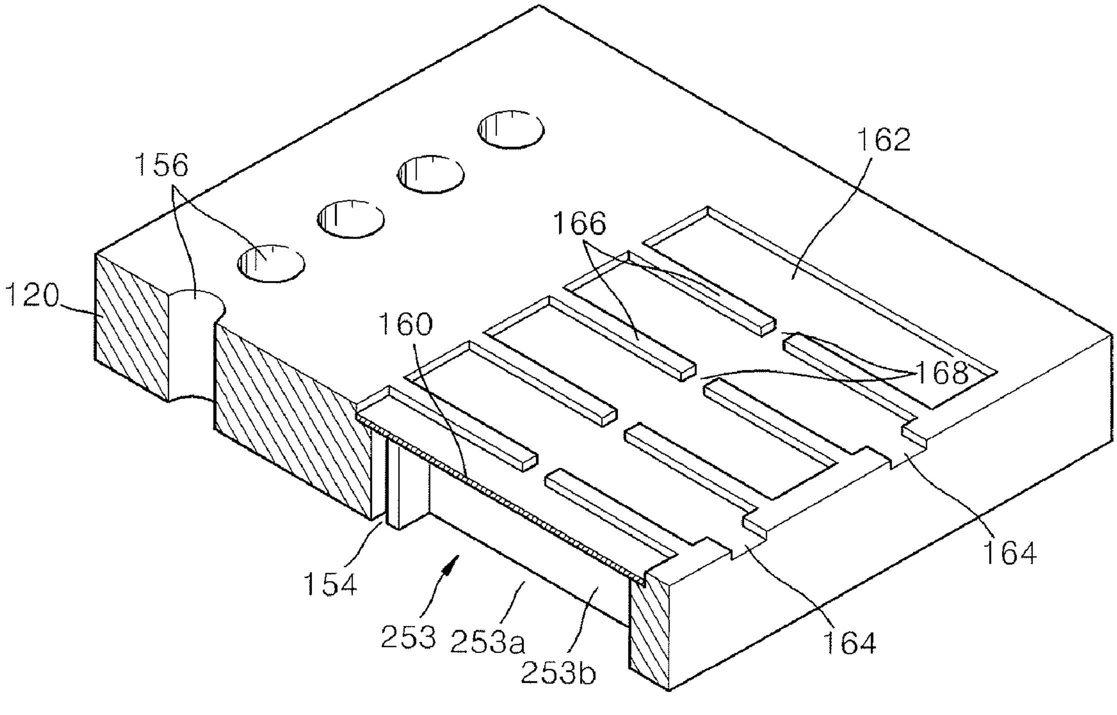
FIG. 5 is a perspective view of the reversed middle substrate of FIG. 4.

FIG. 4 is a perspective view of the middle substrate 120 showing a modified version of the manifold 153 of FIG. 2, and FIG. 5 is a perspective view of the reversed middle substrate of FIG. 4.

Referring to FIG. 4, a manifold 253 formed in the middle substrate 120 can include a plurality of individual manifolds **253*a* defined by a plurality of barrier ribs 253*b* to correspond to each of the pressure chambers 155. Each of the individual manifolds 253*a* is connected to the pressure chambers 155 through the restrictors 154. The pressure chambers 155 and the individual manifolds 253*a*** can be disposed parallel to each other in the same direction.

As described above, since the individual manifolds **253*a* defined by the barrier ribs 253*b* are provided to correspond to each of the pressure chambers 155, although ink backflows from the pressure chambers 155 to the manifold 253 during ink ejection, the individual manifolds 253*a* prevent the adjacent pressure chambers 155 from being directly affected by a pressure change caused by the ink backflow. Accordingly, the cross-talk between the pressure chambers 155** caused due to the backflow of ink during ink ejection can be effectively prevented.

Referring to FIG. 5, a plurality of supporting walls 166 corresponding to the barrier ribs **253*b* can be formed in the cavity 162. The supporting walls 166 support the membrane 160 to prevent the membrane 160 from being damaged due to excessive deformation. A connection groove 168 can be formed in each of the supporting walls 166. The connection grooves 168 connect the entire portions of the cavity 162 to reduce the number of venting channels 164 that connect the cavity 162** to the outside.

The supporting walls 166 and the connection grooves 168 can also be formed in the cavity 162 formed under the manifold 153 of FIG. 2.

Figure 6:
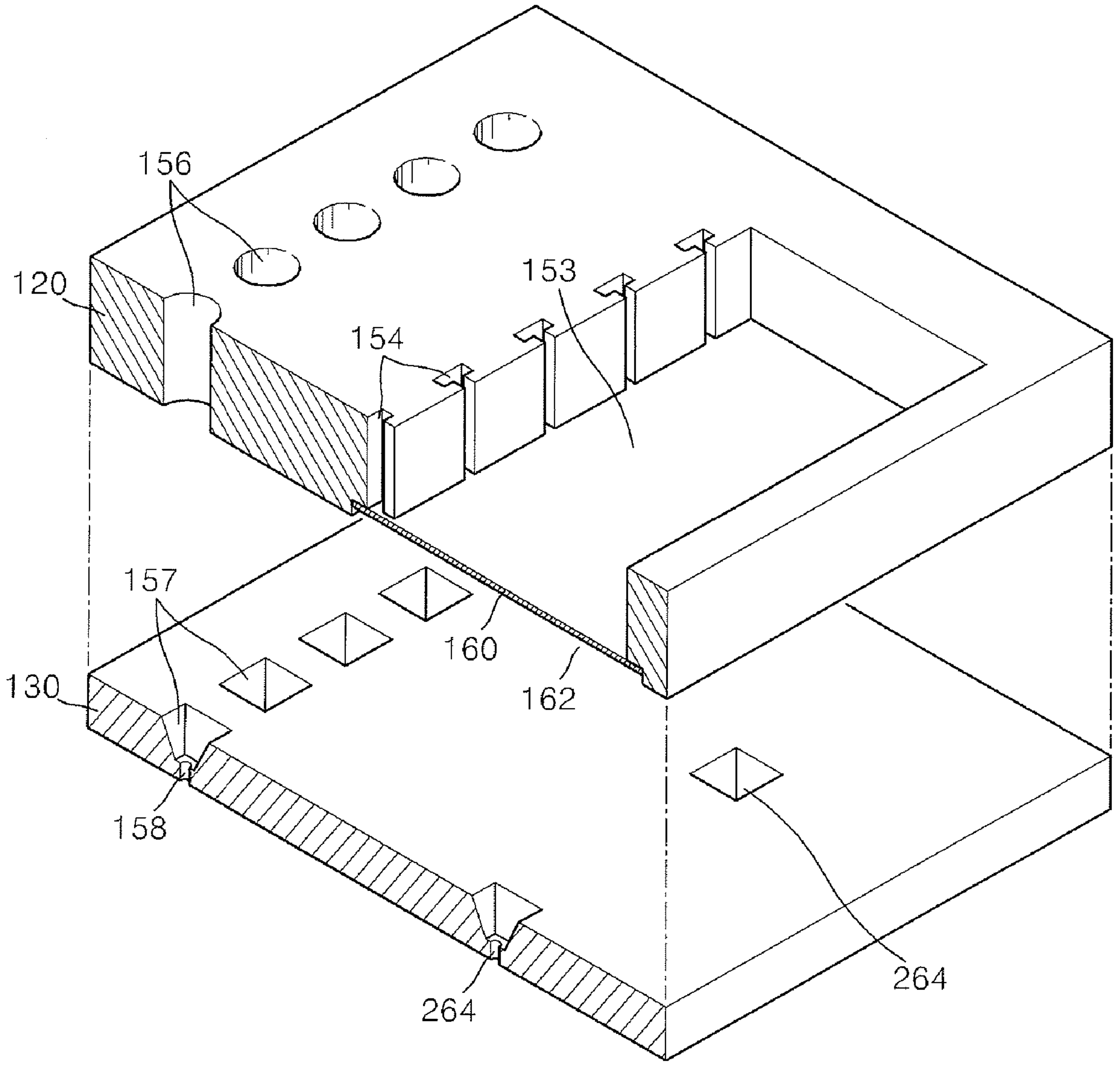
FIG. 6 is a perspective view of a modified version of the venting channel in a middle substrate and a lower substrate of FIG. 2.

FIG. 6 is a perspective view of a modified version of the venting channel in a middle substrate and a lower substrate of FIG. 2.

Referring to FIG. 6, venting channels 264 that connect the cavity 162 to the outside can be vertically formed through the lower substrate 130. Each of the venting channels 264 may have a shape identical to the combined shape of the second damper 157 and the nozzle 158. In this case, the second dampers 157 and the nozzles 158 can be formed simultaneously with the venting channels 264. Thus, the venting channels 264 can be formed without an additional process. Only one venting channel 264 can be formed, however, multiple venting channels 264 separated by appropriate gaps from each other can be formed along the lengthwise direction of the cavity 162.

Figure 7:
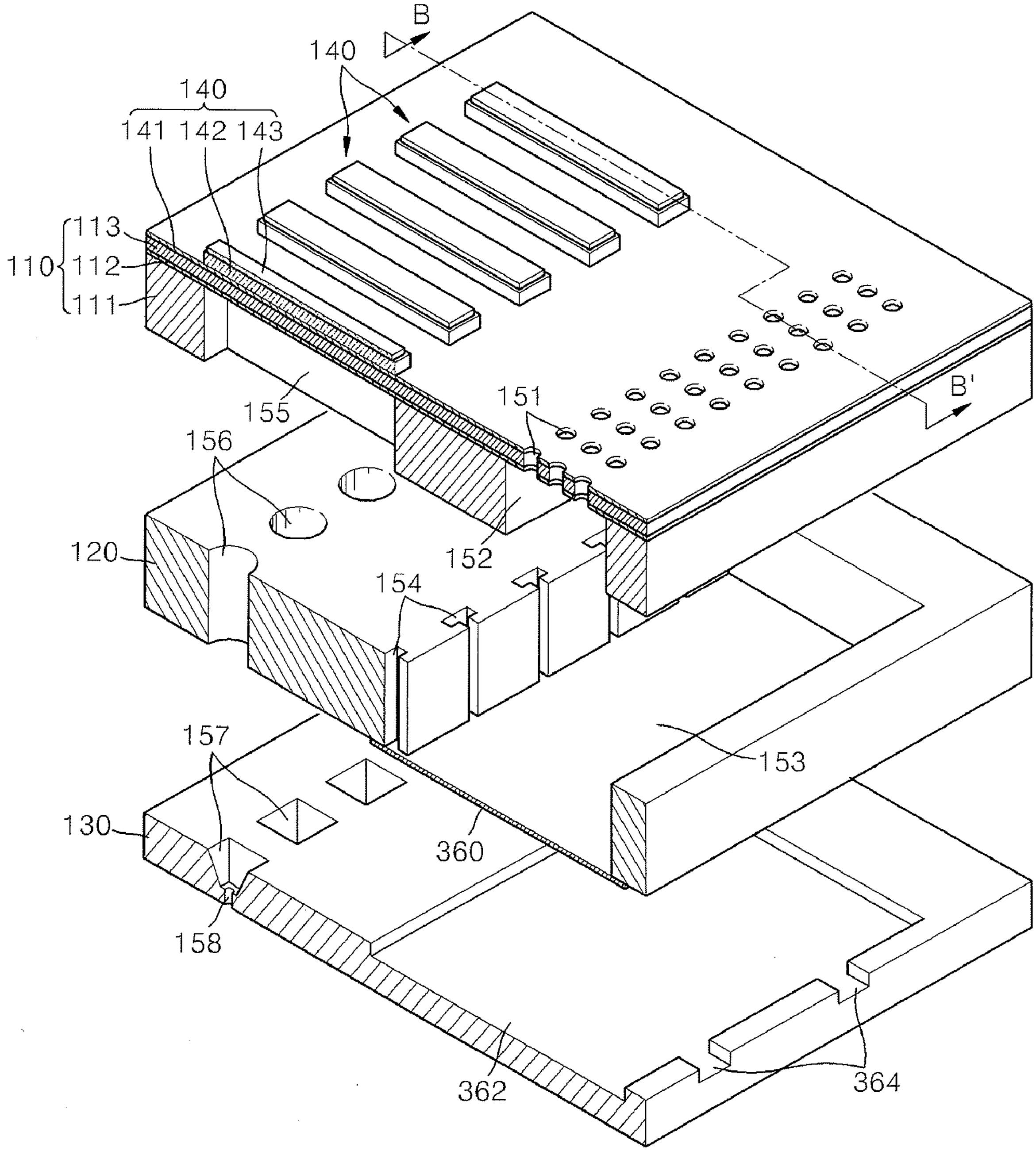
FIG. 7 is a partial cutaway exploded perspective view of a piezoelectric inkjet head according to another embodiment of the present general inventive concept.
Figure 8:
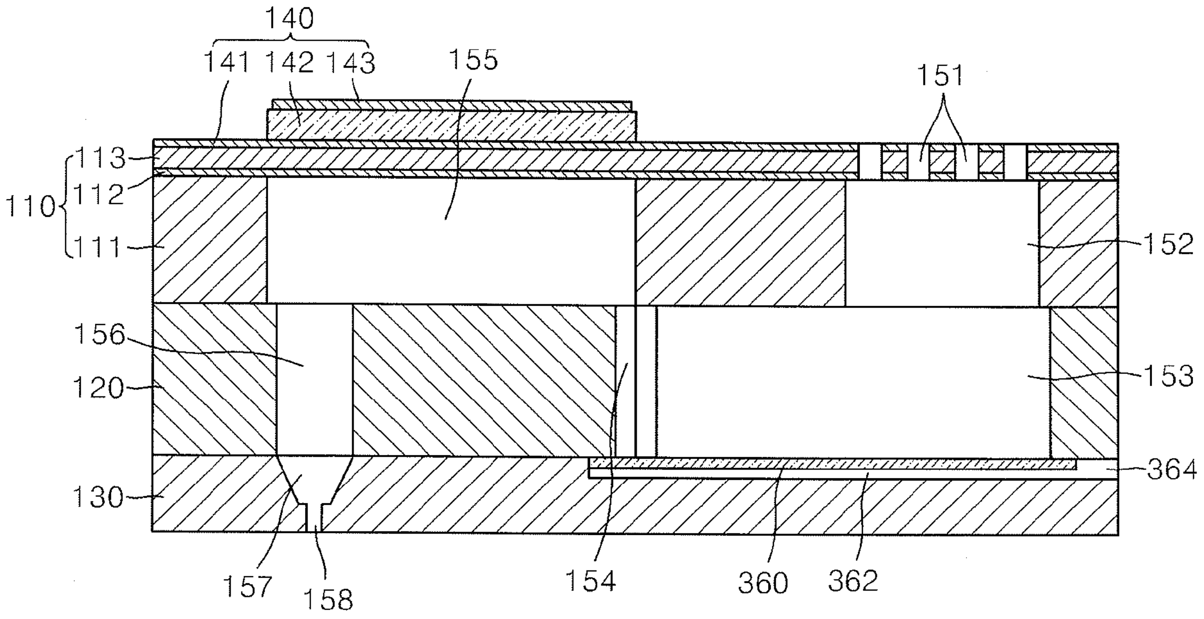
FIG. 8 is a cross-sectional view taken along line B-B' of the assembled piezoelectric inkjet head of FIG. 7.

FIG. 7 is a partial cutaway exploded perspective view of a piezoelectric inkjet head according to another embodiment of the present general inventive concept. FIG. 8 is a cross-sectional view taken along line B-B' of the assembled piezoelectric inkjet head of FIG. 7. The piezoelectric inkjet head according to the present embodiment has the same components as the piezoelectric inkjet head of FIG. 2, however, the locations of the membrane, the venting channels, and the cavity are different than those of FIG. 2. Thus, the differences will be described in detail, however, the rest of the components will be briefly described.

Referring to FIGS. 7 and 8, the piezoelectric inkjet head according to the present embodiment includes three stacked substrates, that is, an upper substrate 110, a middle substrate 120, and a lower substrate 130. An ink flow channel is formed in the three substrates 110, 120, and 130, and a plurality of piezoelectric actuators 140 are formed on the upper surface of the upper substrate 110.

In particular, the upper substrate 110 can be a SOI substrate having a structure in which a first silicon layer 111, a middle oxide film 112, and a second silicon layer 113 are stacked. The upper substrate 110 includes an ink inlet 152, a plurality of pressure chambers 155, and a plurality of filtering holes 151 formed above the ink inlet 152. The piezoelectric actuators 140 are formed on the upper surface of the upper substrate 110 and each of the piezoelectric actuators 140 includes a lower electrode 141, a piezoelectric film 142, and an upper electrode 143.

The middle substrate 120 includes a manifold 153, a plurality of restrictors 154, and a plurality of first dampers 156. The lower substrate 130 includes a plurality of second dampers 157 and a plurality of nozzles 158.

In the present embodiment, a membrane 360 that mitigates a rapid pressure change in the manifold 153 due to the back-flow of ink during ejection is formed in the middle substrate 120, and a cavity 362 that allows the membrane 360 to freely deform and venting channels 364 that connect the cavity 362 to the outside are formed in the lower substrate 130.

More specifically, the membrane 360 is formed on the lower surface of the middle substrate 120 below the manifold 153. Thus, the membrane 360 slightly protrudes from the lower surface of the middle substrate 120. The membrane 360 may be formed of a material, for example, silicon nitride, which is different from the material (silicon) used for forming the middle substrate 120, and may be formed to a thickness of 1 to 3 μm to have an appropriate flexibility and durability. Also, the membrane 360 may have a width slightly greater than that of the manifold 153 to increase a bonding force with the middle substrate 120. That is, a predetermined width of an edge portion of the membrane 360 combines with the lower surface of the middle substrate 120.

The cavity 362 is formed to have a predetermined depth from the upper surface of the lower substrate 130, and has a width equal to or slightly greater than that of the membrane 360. The cavity 362 is formed to have a depth greater than the thickness of the membrane 360 so that a predetermined space can remain between the bottom of the cavity 362 and the membrane 360 when the membrane 360 is inserted into the cavity 362.

The venting channels 364 are formed to have a predetermined depth from the upper surface of the lower substrate 130, preferably, identical to the depth of the cavity 362, and are connected to the outside by extending to an edge of the lower substrate 130 from the cavity 362. One venting channel 364 can be formed, or multiple venting channels 364 separated by appropriate gaps from each other can be formed along the lengthwise direction of the cavity 362.

The embodiments depicted in FIGS. 4 through 6 can be applied to the piezoelectric inkjet head of FIGS. 7 and 8, according to another embodiment of the present general inventive concept. In this case, the piezoelectric inkjet head also provides the same effect as the piezoelectric inkjet head described previously. Thus, the detailed description will not be repeated.

A method of manufacturing the piezoelectric inkjet head according to an embodiment will now be described.

The method will be briefly described. Three substrates, that is, an upper substrate, a middle substrate, and a lower substrate, in which components for constituting an ink flow channel are included, are manufactured. Next, after the three substrates are stacked and combined, a plurality of piezoelectric actuators are formed on the upper substrate. Thus, the manufacture of the piezoelectric inkjet head according to the present general inventive concept is completed. The processes for manufacturing the upper substrate, the middle substrate, and the lower substrate can be performed in any order. That is, the lower substrate or the middle substrate can be formed before the upper substrate, or two substrates or three substrates can be formed at the same time. For convenience of explaining, the method of manufacturing the three substrates will be described in the order of forming the upper substrate, the middle substrate, and the lower substrate, in conjunction with the piezoelectric inkjet head of FIG. 2.

FIGS. 9A through 9E are cross-sectional views illustrating a method of forming a plurality of pressure chambers 155 and an ink inlet 152 in the upper substrate 110.

Figure 9A:
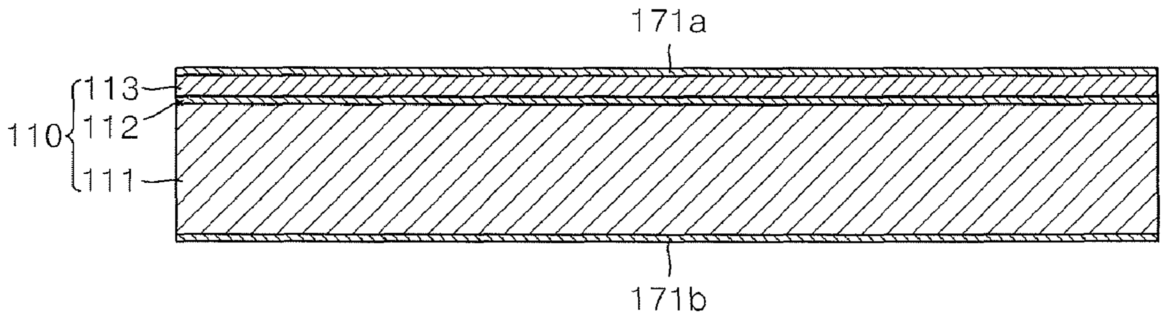
FIGS. 9A through 9E are cross-sectional views illustrating a method of forming pressure chambers and an ink inlet on the upper substrate of FIG. 2, according to an embodiment of the present general inventive concept.

Referring to FIG. 9A, a SOI substrate is prepared as the upper substrate 110. As described above, the SOI substrate has a structure in which a first silicon layer 111, a middle oxide film 112 formed on the first silicon layer 111, and a second silicon layer 113 stacked on the middle oxide film 112 are stacked. Silicon oxide films 171*a* and 171*b* respectively are formed on upper and lower surfaces of the upper substrate 110 by dry or wet oxidizing the upper substrate 110.

Figure 9B:
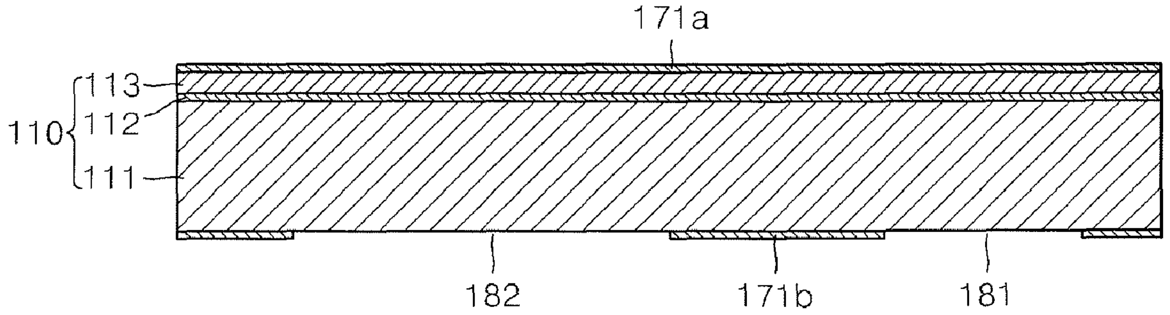

Referring to FIG. 9B, an opening 181 to form the ink inlet 152 and an opening 182 to form the pressure chambers 155 are formed by dry or wet etching the silicon oxide film 171*b* formed on the lower surface of the upper substrate 110.

Figure 9C:
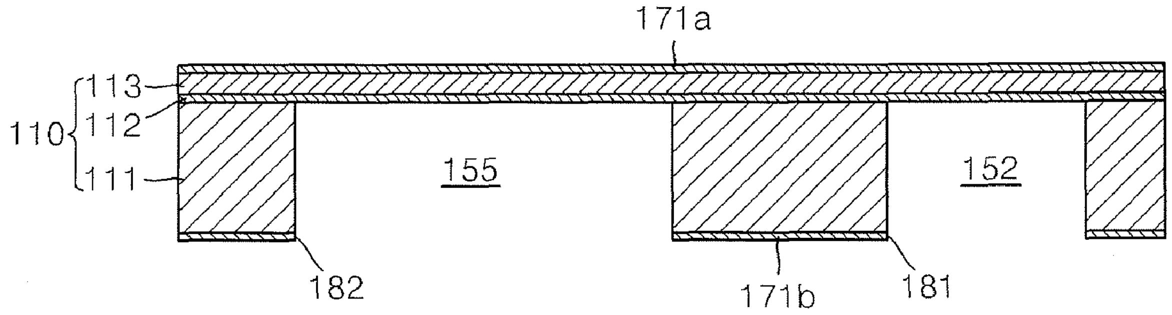

Referring to FIG. 9C, the lower surface of the upper substrate 110 exposed through the openings 181 and 182 is etched. At this point, the etching with respect to the upper substrate 110 can be performed using a dry etching such as a reactive ion etching (RIE) that uses inductively coupled plasma (ICP). If the SOI substrate is used as the upper substrate 110, the middle oxide film 112 of the SOI substrate acts as an etch stop layer. Thus, in this etching operation, only the first silicon layer 111 is etched. Accordingly, the ink inlet 152 and the pressure chambers 155 are formed in the first silicon layer 111 of the upper substrate 110.

Figure 9D:
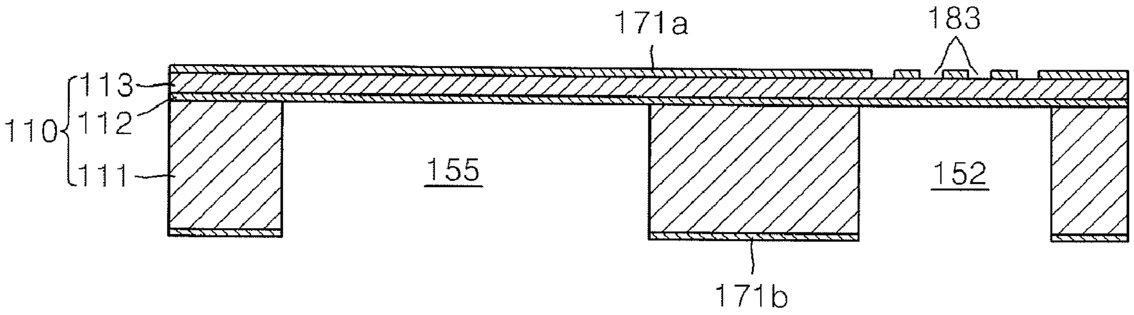

Next, referring to FIG. 9D, a plurality of openings 183 to form filtering holes 151 are formed by etching the silicon oxide film 171*a* formed on the upper surface of the upper substrate 110.

Figure 9E:
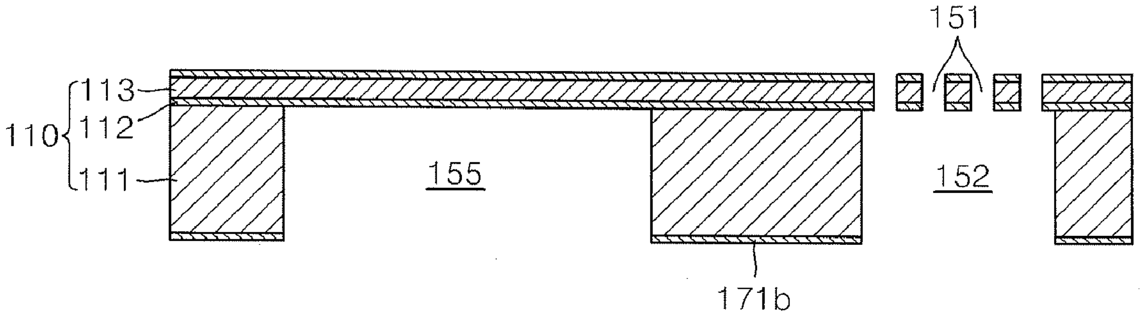

Referring to FIG. 9E, a plurality of filtering holes 151 are formed above the ink inlet 152 by etching the upper surface of the upper substrate 110 exposed through the openings 183. At this point, the filtering holes 151 having a diameter of 10 to 20 μm are formed by sequentially etching the second silicon layer 113 and the middle oxide film 112 of the upper substrate 110.

Next, the silicon oxide film 171*a* and 171*b* remaining on the surface of the upper substrate 110 is removed by wet etching.

FIGS. 10A through 10F are cross-sectional views illustrating a method of forming a membrane, a cavity, venting channels, restrictors, a manifold, and first dampers in the middle substrate of FIG. 2, according to an embodiment of the present general inventive concept.

Figure 10A:
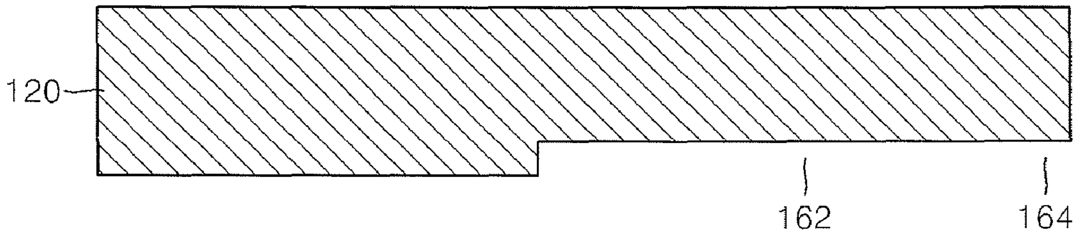
FIGS. 10A through 10F are cross-sectional views illustrating a method of forming a membrane, a cavity, venting channels, restrictors, a manifold, and first dampers in the middle substrate of FIG. 2, according to an embodiment of the present general inventive concept.

Referring to FIG. 10A, a single crystal silicon substrate is prepared as the middle substrate 120 of the piezoelectric inkjet head. A cavity 162 having a predetermined depth is formed on a lower surface of the middle substrate 120. At this point, venting channels 164 that connect the cavity 162 to the outside can be simultaneously formed. The cavity 162 and the venting channels 164 can be formed by dry or wet etching the lower surface of the middle substrate 120.

If supporting walls 166 and connection grooves 168 as depicted in FIG. 5 are formed in the cavity 162, portions of the lower surface of the middle substrate 120 where the supporting walls 166 will be formed are not etched in the operation of etching the lower surface of the middle substrate 120.

Figure 10B:
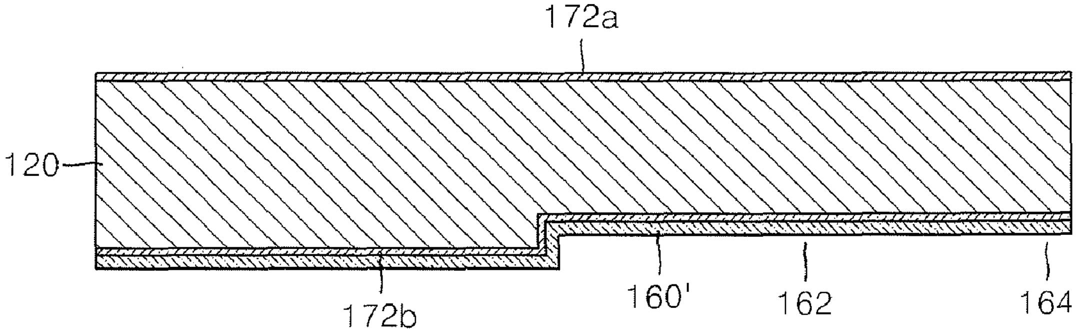

Next, referring to FIG. 10B, silicon oxide films 172*a* and 172*b* respectively are formed on upper and lower surfaces of the middle substrate 120 by wet or dry oxidizing the middle substrate 120 on which the cavity 162 and the venting channels 164 are formed. The silicon oxide film 172*b* formed on the lower surface of the middle substrate 120 is formed on inner surfaces of the cavity 162 and the venting channels 164. A material film 160' is formed by depositing a material different from the material, that is, silicon used to form the middle substrate 120 to a predetermined thickness, for example, 1 to 3 μm, preferably, 1 to 2 μm on the entire surface of the lower surface of the middle substrate 120 on which the silicon oxide film 172*b* is formed using a chemical vapor deposition (CVD) method or a physical vapor deposition (PVD) method. As described above, the material film 160' can be, for example, a silicon nitride film having a high thermal resistance and high etch-selectivity with respect to the oxide film 172*b*.

Figure 10C:
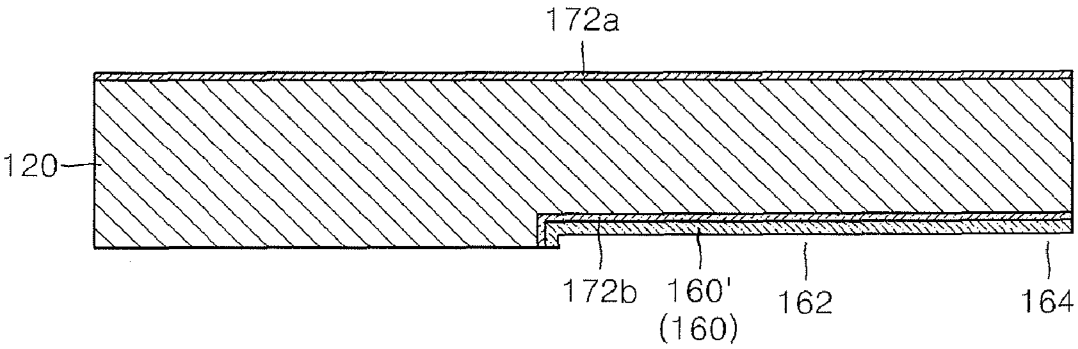

Next, referring to FIG. 10C, the silicon nitride film 160' and the silicon oxide film 172*b* formed on the lower surface of the middle substrate 120 are removed by chemical mechanical polishing. Thus, the silicon nitride film 160' formed on the inner surfaces of the cavity 162 and the venting channels 164 remains. The silicon nitride film 160' remaining in the cavity 162 constitutes a membrane 160.

Figure 10D:
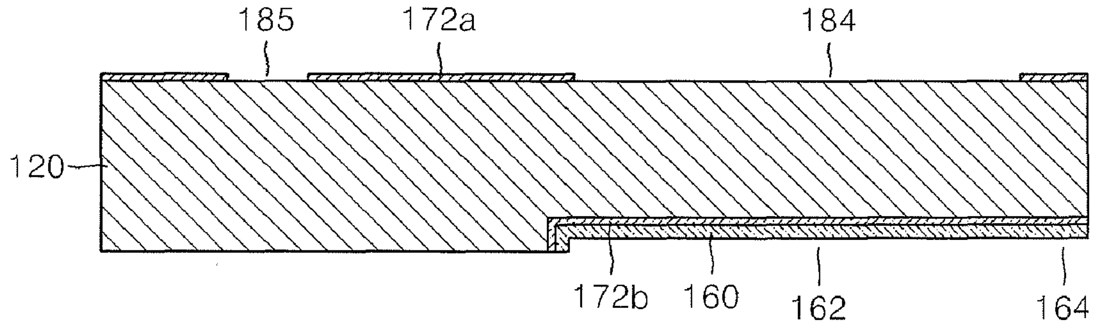

Next, referring to FIG. 10D, openings 184 to form a manifold 153 and a plurality of restrictors 154 and openings 185 to form a plurality of first dampers 156 are formed by dry or wet etching the silicon oxide film 172*a* formed on the upper surface of the middle substrate 120.

Figure 10E:
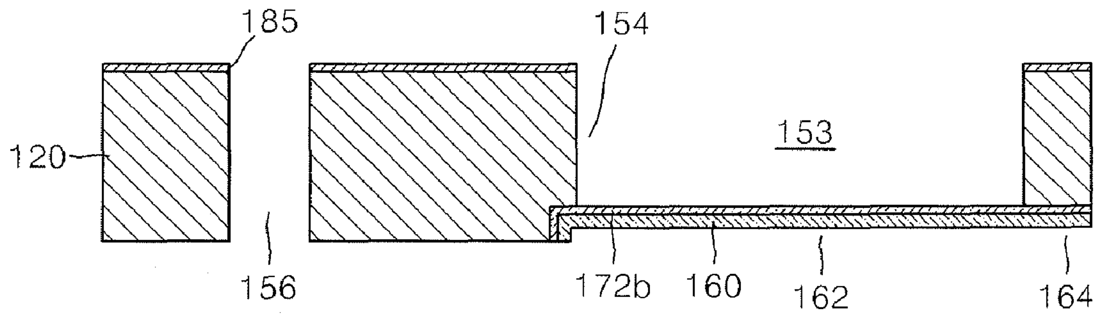

Referring to FIG. 10E, the upper surface of the middle substrate 120 exposed through the openings 184 and 185 is etched. The etching of the middle substrate 120 can be performed by a dry etching method such as a RIE that uses ICP, and is continued until the first dampers 156 are vertically formed through the middle substrate 120. At this point, the manifold 153 and the restrictors 154 have depths shallower than that of the first dampers 156 due to the silicon oxide film 172*b* that acts as an etch stop layer. In this way, according to the present embodiment, the first dampers 156 and the manifold 153 can be formed by one etching process, thereby simplifying the manufacturing process.

Meanwhile, as depicted in FIG. 4, if the manifold 253 having a plurality of individual manifolds 253*a* defined by a plurality of barrier ribs 253*b* is formed in the middle substrate 120, the portions of the middle substrate 120 where the barrier ribs 253*b* are formed are not etched in the above etching process described with reference to FIG. 10E.

Figure 10F:
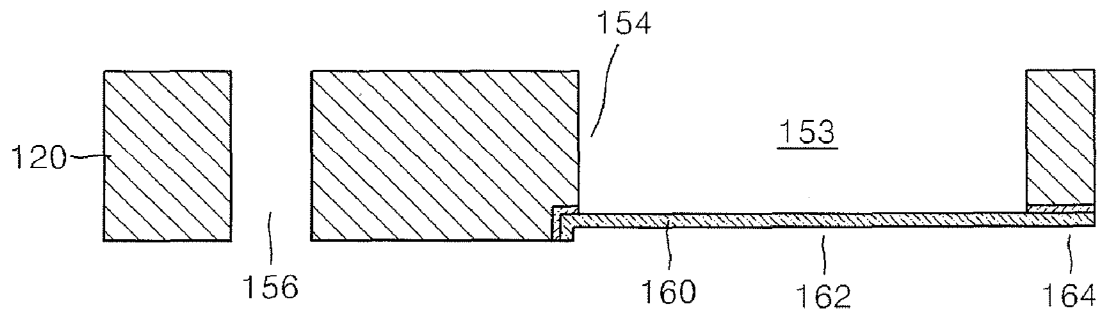

Next, the silicon oxide films 172*a* and 172*b* remaining on the upper and lower surfaces of the middle substrate 120 are removed by wet etching. At this point, the silicon oxide film 172*b* formed below the manifold 153 is removed, however, as depicted in FIG. 10F, the membrane 160 formed below the manifold 153 is not removed since the membrane 160 is formed of the silicon nitride film 160' that has a high etch selectivity with respect to the silicon oxide film 172*b*.

FIGS. 11A through 11D are cross-sectional views illustrating a method of forming second dampers and nozzles in the lower substrate 130 of FIG. 2, according to an embodiment of the present invention.

Figure 11A:
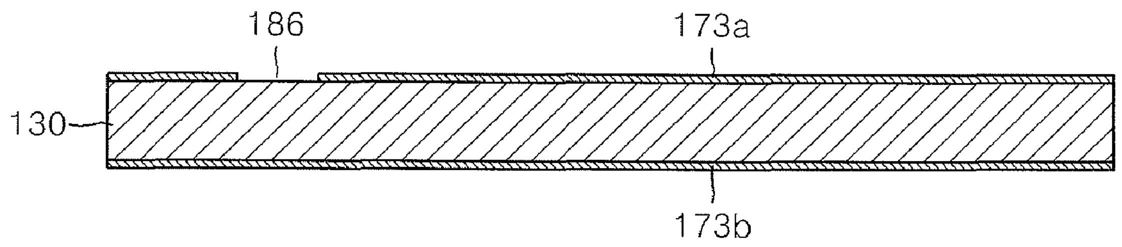
FIGS. 11A through 11D are cross-sectional views illustrating a method of forming second dampers and nozzles in the lower substrate of FIG. 2, according to an embodiment of the present general inventive concept.

Referring to FIG. 11A, a single crystal silicon substrate is prepared as the lower substrate 130 of the piezoelectric inkjet head. Silicon oxide films 173*a* and 173*b* respectively are formed on upper and lower surfaces of the lower substrate 130 by wet or dry oxidizing the lower substrate 130. Openings 186 to form a plurality of second dampers 157 are formed by dry or wet etching the silicon oxide film 173*a* formed on the upper surface of the lower substrate 130.

Figure 11B:
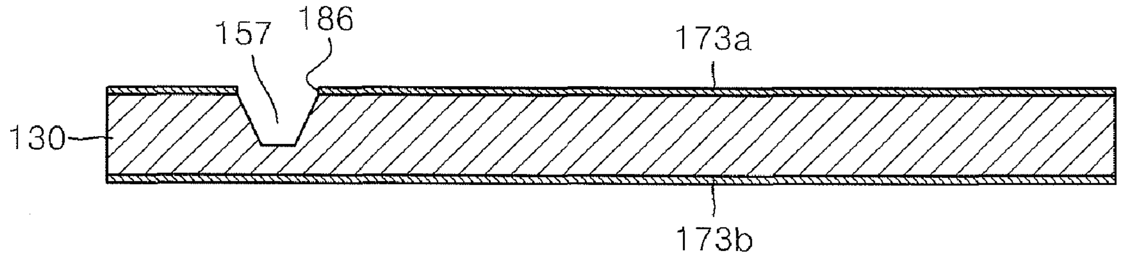

Next, referring to FIG. 11B, the upper surface of the lower substrate 130 exposed through the openings 186 is etched to a predetermined depth. At this point, the wet etching can be performed using an etchant, for example, tetramethyl ammonium hydroxide (TMAH) or potassium hydroxide (KOH). Thus, due to the aniostropical wet etching characteristics, the second dampers 157 having slanted side surfaces can be formed in the upper part of the lower substrate 130.

Figure 11C:
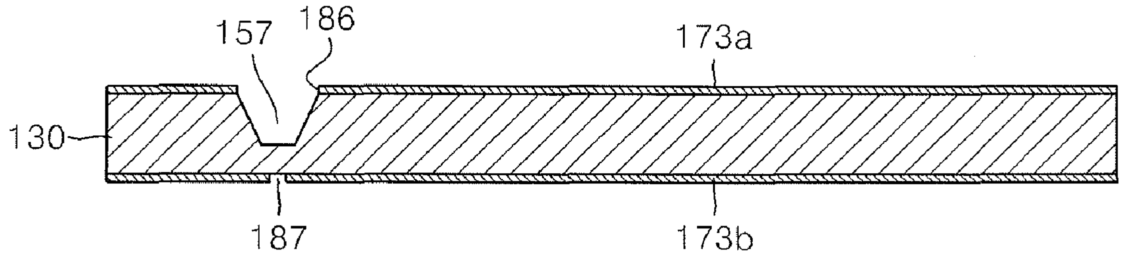

Referring to FIG. 11C, openings 187 to form a plurality of nozzles 158 are formed by dry or wet etching the silicon oxide film 173*b* formed on the lower surface of the lower substrate 130.

Figure 11D:
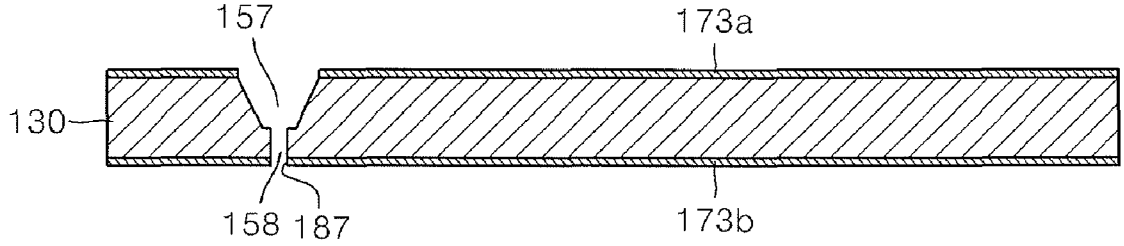

Referring to FIG. 11D, the lower surface of the lower substrate 130 exposed through the openings 187 is etched to a predetermined depth. At this point, the etching of the lower substrate 130 can be performed by dry etching such as RIE that uses ICP. Hence, the nozzles 158 having a circle cross-section with a uniform diameter are formed in the lower substrate 130.

The silicon oxide films 713*a* and 173*b* remaining on the upper and lower surfaces of the lower substrate 130 are removed.

Meanwhile, as depicted in FIG. 6, if the venting channels 264 are formed in the lower substrate 130, the venting channels 264 can be formed simultaneously with the second dampers 157 and the nozzles 158 in the processes described with reference to FIGS. 11A through 11D.

Next, the lower substrate 130, the middle substrate 120, and the upper substrate 110 prepared through the above processes are sequentially stacked as depicted in FIG. 2, and combined with each other. The combining of the three substrates 110, 120, and 130 can be performed using a well known silicon direct bonding (SDB) method.

As described above, after the lower substrate 130, the middle substrate 120, and the upper substrate 110 are sequentially bonded, a plurality of piezoelectric actuators 140 are formed on the upper surface of the upper substrate 110. More specifically, first, a lower electrode 141 is formed by depositing a conductive metal material on the upper surface of the upper substrate 110. The lower electrode 141 is formed to a thickness of approximately 2,000 Å. At this point, the filtering holes 151 already formed in the upper substrate 110 are not clogged by the lower electrode 141 since the filtering holes 151 have a diameter of 10 to 20 μm. Next, piezoelectric films 142 and upper electrodes 143 are formed on the lower electrode 141. The piezoelectric films 142 are formed by drying a coating of a piezoelectric material for a predetermined time after a paste of the piezoelectric material is coated to a predetermined thickness on the pressure chambers 155 using a screen printing method. Various materials can be used for the piezoelectric material, however, preferably, a lead zirconate titanate (PZT) ceramic material is usually used. Afterwards, the upper electrodes 143 are formed by printing an electrode material, for example, Ag—Pd paste on the dried piezoelectric films 142. When the piezoelectric films 142 and the upper electrodes 143 are sintered at a predetermined temperature, for example, 900 to 1,000° C., the piezoelectric actuators 140 comprising the lower electrode 141, the piezoelectric films 142, and the upper electrodes 143 are formed on the upper substrate 110.

Thus, the manufacture of a piezoelectric inkjet head of FIG. 2, according to an embodiment of the present general inventive concept is completed.

A method of manufacturing the piezoelectric inkjet head of FIG. 7, according to another embodiment of the present general inventive concept will now be described. In the method of manufacturing the piezoelectric inkjet head of FIG. 7, the method of forming the upper substrate 110 is the same as the method of forming the upper substrate 110 of the piezoelectric inkjet head of FIG. 2, thus, the description thereof will not be repeated.

FIGS. 12A through 12E are cross-sectional views illustrating a method of forming a membrane, restrictors, a manifold, and first dampers in the middle substrate of FIG. 7, according to another embodiment of the present general inventive concept.

Figure 12A:
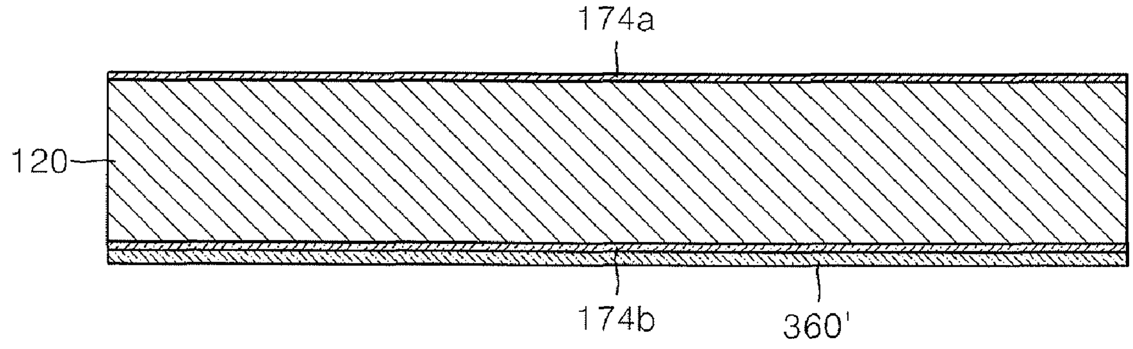
FIGS. 12A through 12E are cross-sectional views illustrating a method of forming a membrane, restrictors, a manifold, and first dampers in the middle substrate of FIG. 7, according to another embodiment of the present general inventive concept.

Referring to FIG. 12A, a single crystal silicon substrate is prepared as a middle substrate 120 of the piezoelectric inkjet head. Silicon oxide films 174*a* and 174*b* respectively are formed on upper and lower surfaces of the middle substrate 120 by wet or dry oxidizing the middle substrate 120. A material film 360' is formed by depositing a material different from the material, that is, silicon used to form the middle substrate 120 to a predetermined thickness, for example, 1 to 3 μm, preferably, 1 to 2 μm on the entire surface of the lower surface of the middle substrate 120 on which the silicon oxide film 174*b* is formed using a chemical vapor deposition (CVD) method or a physical vapor deposition (PVD) method. As described above, the material film 360' can be, for example, a silicon nitride film having a high thermal resistance and high etch-selectivity with respect to the oxide film 174*b*.

Figure 12B:
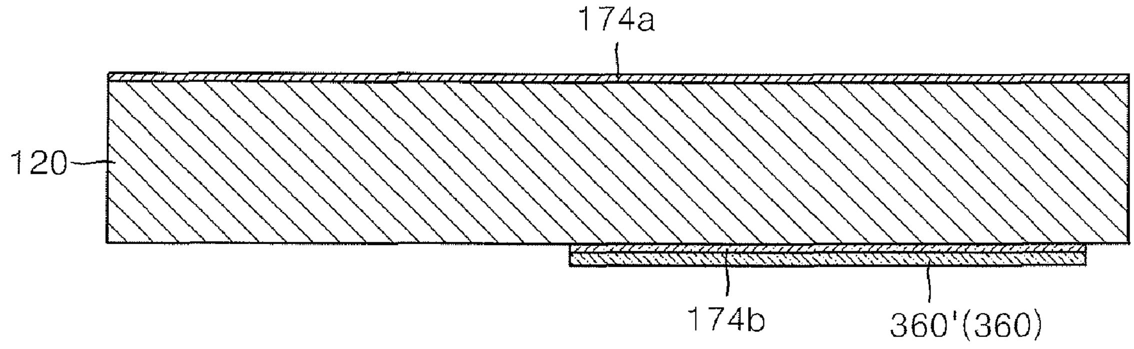

Referring to FIG. 12B, the silicon oxide film 174*b* and the silicon nitride film 360' formed on the lower surface of the middle substrate 120 are partially wet or dry etched to remain the silicon oxide film 174*b* and the silicon nitride film 360' formed where a manifold 153 will be formed. The remaining silicon nitride film 360' constitutes a membrane 360.

Figure 12C:
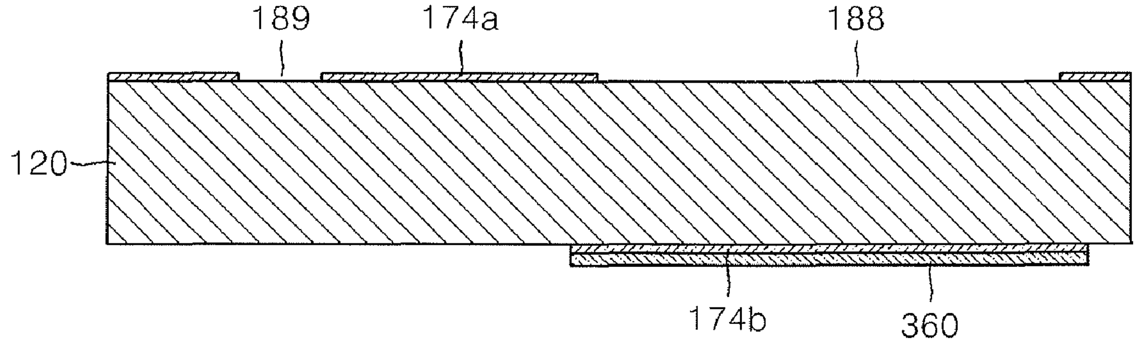

Next, referring to FIG. 12C, openings 188 to form a manifold 153 and restrictors 154 and openings 189 to form first dampers 156 are formed by dry or wet etching the silicon oxide film 174*a* formed on the upper surface of the middle substrate 120.

Figure 12D:
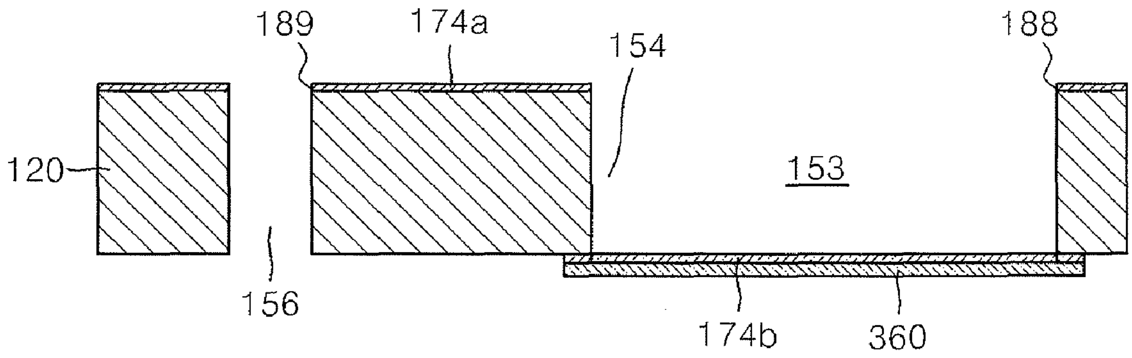

Referring to FIG. 12D, the upper surface of the middle substrate 120 exposed through the openings 188 and 189 is etched. The etching of the middle substrate 120 can be performed by a dry etching method such as a RIE that uses ICP, and is continued until the first dampers 156 are vertically formed through the middle substrate 120. At this point, the etching of the middle substrate 120 to form the manifold 153 and the restrictors 154 is performed until the silicon nitride film 174*b* that acts as an etch stop layer is exposed.

Meanwhile, as depicted in FIG. 4, if the manifold 253 having a plurality of individual manifolds 253*a* defined by a plurality of barrier ribs 253*b* is formed in the middle substrate 120, the portions of the middle substrate 120 where the barrier ribs 253*b* are formed are not etched in the above etching process described with reference to FIG. 12D.

Figure 12E:
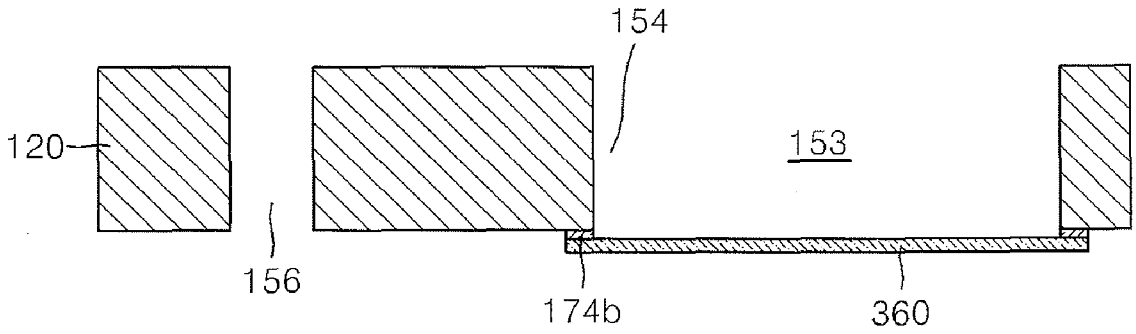

Next, the silicon oxide films 174*a* and 174*b* remaining on the upper and lower surfaces of the middle substrate 120 are removed by wet etching. At this point, the silicon oxide film 174*b* formed below the manifold 153 is removed, however, as depicted in FIG. 12E, the membrane 360 formed below the manifold 153 is not removed since the membrane 360 is formed of the silicon nitride film 360' that has a high etch selectivity with respect to the silicon oxide film 174*b*.

Figure 13A:
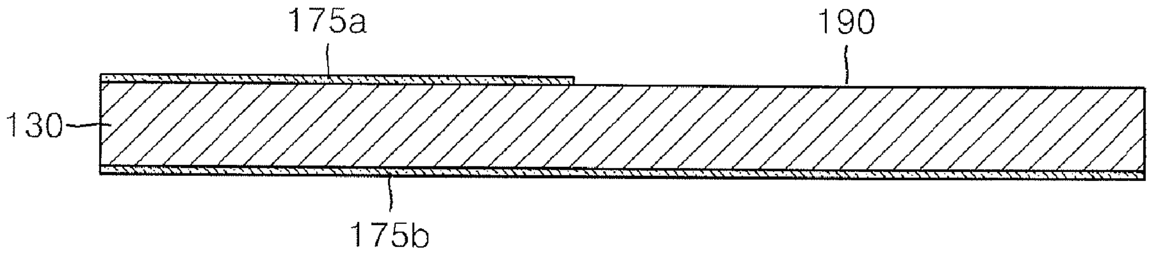
FIGS. 13A and 13B are cross-sectional views illustrating a method of forming a cavity and venting channels in the lower substrate of FIG. 7, according to another embodiment of the present general inventive concept.
Figure 13B:
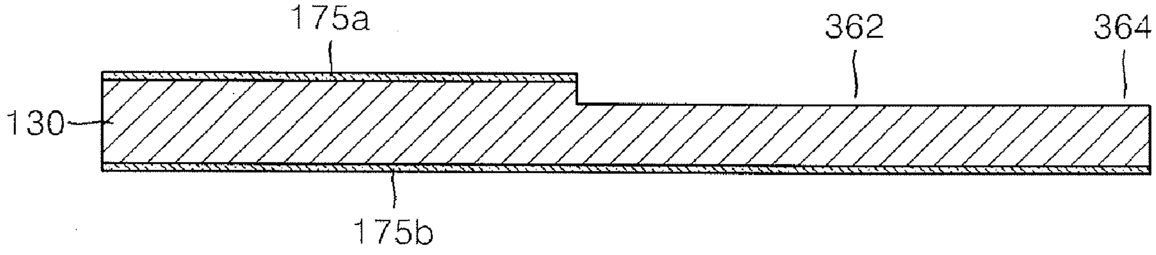

FIGS. 13A and 13B are cross-sectional views illustrating a method of forming a cavity and venting channels in the lower substrate 130 of FIG. 7, according to another embodiment of the present general inventive concept.

Referring to FIG. 13A, a single crystal silicon substrate is prepared as the lower substrate 130 of the piezoelectric inkjet head. Silicon oxide films 175*a* and 175*b* respectively are formed on upper and lower surfaces of the lower substrate 130 by wet or dry oxidizing the lower substrate 130. An opening 190 to form a cavity 362 and plurality of venting channels 364 is formed by dry or wet etching the silicon oxide film 175*a* formed on the upper surface of the lower substrate 130.

Next, referring to FIG. 13B, the cavity 362 having a predetermined depth and the venting channels 364 are formed by dry or wet etching the upper surface of the lower substrate 130 exposed through the opening 190.

Meanwhile, as depicted in FIG. 5, when the supporting walls 166 and the connection grooves 168 are formed in the cavity 362, the portions of the upper surface of the lower substrate 130 where the supporting walls 166 are formed are not etched in the process of etching the lower substrate 130 described with reference to FIG. 13B.

Next, second dampers 157 and nozzles 158 are formed in the lower substrate 130. The processes for forming the second dampers 157 and the nozzles 158 in the present embodiment are the same as the processes for forming the second dampers 157 and the nozzles 158 described with reference to FIGS. 11A through 11D, and thus, the descriptions thereof will not be repeated.

Next, the lower substrate 130, the middle substrate 120, and the upper substrate 110 prepared through the above processes are sequentially stacked as depicted in FIG. 7, and combined with each other. Afterwards, a plurality of piezoelectric actuators 140 are formed on the upper surface of the upper substrate 110. These processes are also the same as the processes described above, thus, the descriptions thereof will not be repeated.

Thus, the manufacture of a piezoelectric inkjet head of FIG. 7, according to another embodiment of the present general inventive concept is completed.

As described above, according to the various embodiments of the present general inventive concept, a flexible membrane that is formed under a manifold mitigates a rapid pressure change in the manifold, which is caused by ink backflow from pressure chambers. Hence, cross-talk between adjacent pressure chambers can be effectively prevented during ejecting ink to the outside through nozzles. Accordingly, a uniform ink ejection performance can be obtained resulting in increasing printing quality. Also, since meniscus of ink can be rapidly stabilized in the nozzles after ejecting ink, and thereby increasing ejection frequency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a piezoelectric inkjet head, comprising:

(a) preparing an upper substrate, a middle substrate, and a lower substrate, which are formed of silicon;

(b) forming an ink inlet and a plurality of pressure chambers to be filled with ink to be ejected by finely processing the upper substrate;

(c) forming a manifold connected to the ink inlet, a plurality of restrictors that connect the manifold to the pressure chambers, and a plurality of first dampers in locations corresponding to the pressure chambers by finely processing the middle substrate;

(d) forming a plurality of nozzles to eject the ink by finely processing the lower substrate;

(e) bonding the lower substrate, the middle substrate, and the upper substrate by sequentially stacking them; and (f) forming a plurality of piezoelectric actuators that provide a driving force to eject ink on the upper surface of the upper substrate, wherein (c) comprises forming a membrane under the manifold to mitigate a rapid pressure change in the manifold using a material different from the material used to form the middle substrate, and (c) or (d) comprises forming a cavity located under the membrane and at least one venting channel that connects the cavity to the outside on the lower surface of the middle substrate or the upper surface of the lower substrate.

2. The method of claim 1, wherein the membrane is formed of silicon nitride.

3. The method of claim 1, wherein the membrane has a thickness of 1 to 3 μm.

4. The method of claim 1, wherein (c) comprises:

forming the cavity having a predetermined depth by etching the lower surface of the middle substrate;

forming a silicon oxide film on the lower surface of the middle substrate and an inner surface of the cavity;

forming a material film different from silicon on the entire surface of the silicon oxide film;

forming the membrane formed of the material film remaining in the inner surface of the cavity by removing the silicon oxide film and the material film formed on the surface of the middle substrate except for the portion formed on the inner surface of the cavity using a chemical mechanical polishing (CMP) method;

forming the manifold, the restrictors, and the first dampers by etching the upper part of the middle substrate from the upper surface of the middle substrate; and removing the silicon oxide film.

5. The method of claim 4, wherein the material film is a silicon nitride film.

6. The method of claim 4, wherein the manifold and the restrictors are formed to have a depth smaller than that of the first damper due to the silicon oxide film that acts as an etch stop layer.

7. The method of claim 4, wherein, in the forming of the cavity, at least one venting channel is formed together with the cavity on the lower surface of the middle substrate.

8. The method of claim 4, wherein the venting channels are vertically formed through the lower substrate in the operation for forming the nozzles.

9. The method of claim 1, wherein, (c) comprises:

sequentially forming the silicon oxide film and the material film using a material different from silicon on the lower surface of the middle substrate;

forming the membrane formed of the material film remaining on a portion where the manifold is formed by partially removing the silicon oxide film and the material film by etching;

forming the manifold, the restrictors, and the first dampers by etching the upper part of the middle substrate from the upper surface of the middle substrate; and removing the silicon oxide film, and (d) comprises forming the cavity having a predetermined depth by etching the upper surface of the lower substrate.

10. The method of claim 9, wherein the material film is a silicon nitride film.

11. The method of claim 9, wherein, in the forming of the cavity, at least one venting channel is formed together with the cavity on the lower surface of the middle substrate.

12. The method of claim 1, wherein (a) comprises forming a plurality of filtering holes above the ink inlet.

13. The method of claim 1, wherein, in (c), the manifold is formed to comprise a plurality of individual manifolds defined by a plurality of barrier ribs to correspond the each of the pressure chambers.

14. The method of claim 1, wherein (c) or (d) comprises forming supporting walls that support the membrane in the cavity.

15. The method of claim 1, wherein (d) comprises forming a plurality of second dampers that connect the first dampers to the nozzles in the upper part of the lower substrate.

16. The method according to claim 1, wherein the step of forming a manifold comprises:

forming the membrane on a second surface of the middle substrate opposite that of a first surface, wherein the first surface is adjacent to the upper substrate, and wherein the rapid pressure change in the manifold is caused by operation of the piezoelectric actuator.

* * * * *